(12) United States Patent
Ying

(10) Patent No.: US 10,549,649 B2
(45) Date of Patent: Feb. 4, 2020

(54) MAXIMUM CURRENT CALCULATION AND POWER PREDICTION FOR A BATTERY PACK

(71) Applicant: GM Global Technology Operations LLC, Detroit, MI (US)

(72) Inventor: Ramona Y. Ying, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 158 days.

(21) Appl. No.: 15/809,316

(22) Filed: Nov. 10, 2017

(65) Prior Publication Data

US 2019/0143820 A1  May 16, 2019

(51) Int. Cl.
| | |
|---|---|
| *G01R 31/374* | (2019.01) |
| *G01R 31/389* | (2019.01) |
| *G01R 31/3842* | (2019.01) |
| *B60L 50/51* | (2019.01) |
| *B60L 58/12* | (2019.01) |
| *B60L 53/10* | (2019.01) |
| *G01R 31/388* | (2019.01) |

(52) U.S. Cl.
CPC ............... *B60L 53/11* (2019.02); *B60L 50/51* (2019.02); *B60L 58/12* (2019.02); *G01R 31/374* (2019.01); *G01R 31/388* (2019.01); *G01R 31/389* (2019.01); *G01R 31/3842* (2019.01)

(58) Field of Classification Search
CPC .. G01R 31/36; G01R 31/362; G01R 31/3663; G01R 31/3675; G01R 31/3606; G01R 31/3662; G01R 31/3648; G06F 19/00; B60R 16/04; H02J 7/14; H02J 7/0047; H02J 7/007; H02J 7/0029; H02J 7/0013; H02J 7/0014
USPC .......... 307/10.6, 10.1, 10.2, 9.1, 109, 17, 37; 702/63; 320/120, 108, 129
See application file for complete search history.

(56) References Cited

U.S. PATENT DOCUMENTS

| 9,989,595 | B1 * | 6/2018 | Wang | ................... G01R 31/387 |
| 2007/0069734 | A1 * | 3/2007 | Bertness | .............. G01R 31/007 324/411 |
| 2012/0029851 | A1 * | 2/2012 | Nakayama | ......... G01R 31/3842 702/63 |

(Continued)

*Primary Examiner* — Rexford N Barnie
*Assistant Examiner* — Jagdeep S Dhillon
(74) *Attorney, Agent, or Firm* — Quinn IP Law

(57) ABSTRACT

A method for predicting power capability of a battery pack in a system includes determining an open-circuit voltage of the battery pack via a controller, calculating pack resistance using measured voltage and current during a charge or discharge event, and calculating a maximum current of the pack using the open-circuit voltage and internal resistance. The method includes selecting the lower of an absolute value of each of the calculated maximum discharge current and predetermined current limit, calculating the discharge power capability of the battery pack using the selected lower absolute value, and controlling a state of the system using the calculated power capability. The method also controls the charging current and parameters during a DC fast-charging operation. A system includes the battery pack, electric machine, and controller. The system may be a vehicle having an electric powertrain, with an electric machine powered by the battery pack.

18 Claims, 5 Drawing Sheets

(56) References Cited

U.S. PATENT DOCUMENTS

| | | | | |
|---|---|---|---|---|
| 2014/0278167 | A1* | 9/2014 | Frost | B60L 58/16 |
| | | | | 702/63 |
| 2015/0162758 | A1* | 6/2015 | Dong | H02J 7/0021 |
| | | | | 320/112 |
| 2015/0321576 | A1* | 11/2015 | Lee | B60L 58/12 |
| | | | | 701/22 |
| 2015/0338466 | A1* | 11/2015 | Wu | G01R 31/3648 |
| | | | | 320/126 |
| 2016/0114696 | A1* | 4/2016 | Eifert | B60L 11/1861 |
| | | | | 320/134 |
| 2016/0272080 | A1* | 9/2016 | Chang | B60L 11/1861 |
| 2016/0276843 | A1* | 9/2016 | Chang | B60L 11/187 |
| 2017/0242079 | A1* | 8/2017 | Duan | G01R 31/3648 |
| 2018/0313899 | A1* | 11/2018 | Yasunori | B60R 16/033 |
| 2018/0328993 | A1* | 11/2018 | Yasunori | B60R 16/04 |

* cited by examiner

MAXIMUM CURRENT CALCULATION AND POWER PREDICTION FOR A BATTERY PACK

INTRODUCTION

A vehicle powertrain may include one or more electric machines. Motor torque generated by the electric machine(s) may be used to propel the vehicle, crank and start an internal combustion engine, and/or perform other high-voltage functions. A power inverter may be used as part of an electrical system of such a powertrain. Controlled switching and signal filtering operations performed within the power inverter ultimately produce an alternating current (AC) output voltage suitable for powering individual phase windings of the electric machine(s). The battery pack may be recharged via an offboard power supply, such as an available AC wall outlet. Alternatively, a direct current (DC) fast-charging process may be used to reduce overall charging times relative to standard AC charging processes.

SUMMARY

A controller-executed method is disclosed herein for use with a vehicle or other system having an electric machine that is energized by a direct current (DC) battery pack. Using the method, a controller calculates the maximum current, i.e., a maximum charge and discharge current for the battery pack, and thereafter predicts a true power capability of the battery pack within the system. The controller also controls an operation of the battery pack and/or the system using the predicted power capability.

The power capability of a multi-cell battery pack largely depends on the battery pack's electrical characteristics, e.g., its current and voltage levels, enforced power limits, temperature, and age. Current limits may be predetermined by a manufacturer or supplier of the battery pack at levels intended to prevent excessive charging or discharging rates. The current limits or the battery pack's voltage limits thus limit the continuous power output of the battery pack over a particular time window, such as 10-20 seconds. In a vehicle in particular, a given electric machine may be configured as a traction motor outputting torque that ultimately propels the vehicle. Thus, the placement of such limits on the battery pack effectively limits the maximum sustainable motor speed, acceleration, and/or torque.

It is recognized herein that the above-noted manufacturer-defined limits may be overly conservative or aggressive in view of actual operating conditions and/or battery pack age. As a result, the controller may overestimate or underestimate the true battery power capability, which in turn may lead to less than optimal system control decisions within the controller's logic. The present disclosure is therefore intended to provide an alternative approach to the exclusive use of predetermined/manufacturer-defined battery limits by configuring the controller to situationally substitute a calculated maximum current into a battery power capability calculation function so as to optimize battery pack performance.

In an example embodiment, a method for calculating a maximum current and predicting a power capability of a battery pack in a system includes determining an open-circuit voltage of the battery pack via a controller, and also calculating an internal resistance of the battery pack using a measured voltage and current. The method includes calculating the maximum current using the open-circuit voltage and the internal resistance, as well as selecting the lower of an absolute value of the calculated maximum current and an absolute value of a predetermined current limit. Thereafter, the controller predicts the power capability using the selected lower absolute value and automatically controls a state of the system using the calculated power capability.

Determining the open-circuit voltage may include measuring and/or back-calculating the open-circuit voltage, either of the battery pack as a whole or of individual battery cells of the battery pack. Calculating the maximum current may occur at various states of charge and temperatures of the battery pack. Similarly, the maximum current may be calculated at different ages of the battery pack such that the calculated power capability corresponds to an actual age of the battery pack. In this manner, the method may adapt to the aging battery for improved predictive accuracy.

The system may include an electric machine powered by the battery pack. In such an embodiment, controlling the state of the system may include controlling a speed, torque, and/or acceleration of the electric machine.

The electric machine may be powered by the battery pack in a system having an engine, with controlling the state of the system including cranking and starting the engine using the electric machine.

The system, e.g., a vehicle, may be configured to receive a DC charging current in multiple charging stages via a DC fast-charging process. The method in such an embodiment may include correlating the open circuit voltage and charge voltage with respective states of charge of the battery pack as a set of correlation data, and then predicting, via the controller using the correlation data, a state of charge of the battery pack attainable for each of the DC charging stages. The controller may also predict a charging time for achieving a target SOC. Controlling the state of the system may include controlling a charging duration of the DC fast-charging process using the predicted charging time. In some embodiments the measured charge voltage (and thus charge resistance) can be calculated as the battery pack ages, such that the charging time and attainable state of charge can be predicted throughout the battery pack's operation.

In another embodiment, a vehicle or other system includes a multi-cell high-voltage battery pack, an electric machine that is electrically connected to and driven by the battery pack, and a controller in communication with the battery pack. The controller predicts a power capability of the battery pack via execution of instructions by a processor of the controller. Execution of the instructions causes the controller to determine an open-circuit voltage of the battery pack, calculate an internal resistance of the battery pack using a measured voltage and current, and calculate a maximum current using the open-circuit voltage and the internal resistance. Code execution also causes the controller to select the lower of an absolute value of the calculated maximum current and an absolute value of a predetermined current limit, to calculate the power capability of the battery pack using the selected lower value, and to control a state of the system using the calculated power capability.

A vehicle is also disclosed that includes a set of drive wheels, a battery pack, an electric traction motor having an output member that is coupled to the drive wheels, and that is electrically connected to and driven by the battery pack, and a controller programmed or configured to execute the method noted above.

The above features and advantages and other features and advantages of the present disclosure are readily apparent from the following detailed description of the best modes for carrying out the disclosure when taken in connection with the accompanying drawings.

DETAILED DESCRIPTION

Figure 1:
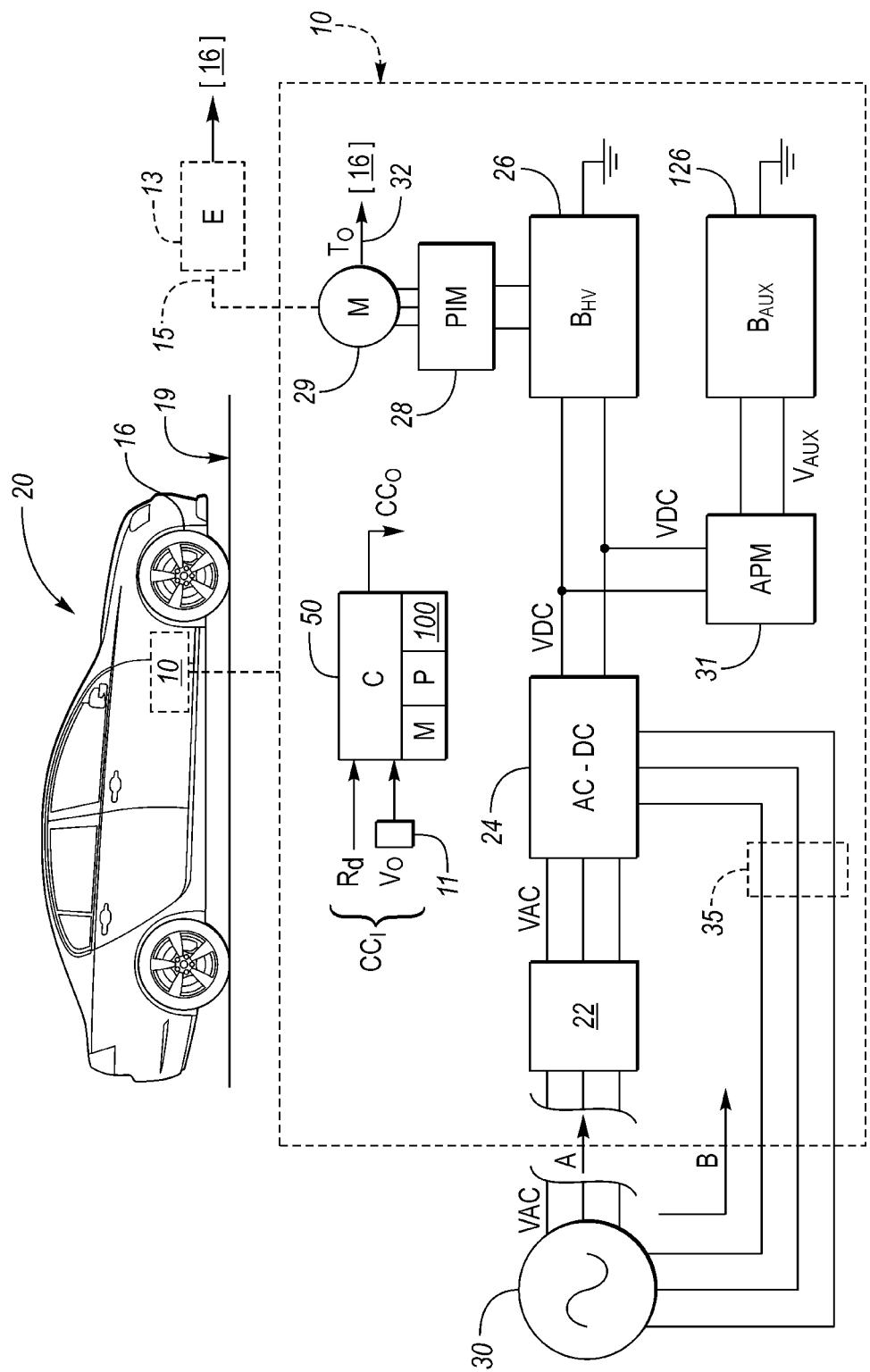
FIG. 1 is a schematic illustration of an example vehicle having an electric powertrain and a controller configured to execute a current calculation and battery power capability prediction method as set forth herein.

Referring to the drawings, wherein like reference numbers refer to the same or like components in the several Figures, an electrical system 10 is shown schematically in FIG. 1. The electrical system 10 may be used with an example vehicle 20 or another system having a high-voltage battery pack ($B_{HV}$) 26, e.g., a multi-cell lithium ion, zinc-air, nickel-metal hydride, or lead acid direct current (DC) battery pack. In some embodiments, the battery pack 26 may be selectively recharged using an offboard power supply 30. Charging power flow may occur through a charging path A in a plug-in charging operation, with an alternating current voltage (VAC) delivered at a suitable voltage level, e.g., 110/220 VAC. The battery pack 26 may be recharged during operation of the vehicle 20, for instance via energy recapture during a regenerative braking event. Alternatively, the offboard power supply 30 may be embodied as a DC "fast-charging" power supply providing charging currents at higher DC voltages, e.g., 240-480 volts (VDC) or more.

The electrical system 10 is regulated by a controller (C) 50. As part of its regulating function, the controller 50 may be programmed with computer-readable instructions 100 embodying a method for determining a maximum charging or discharging current and associated power capability of the battery pack 26, and for thereafter controlling an operation of the battery pack 26 and/or the vehicle 20 or other system using the battery pack 26. While a vehicular application is described below with reference to FIGS. 1-5 for illustrative consistency, a wider range of possible battery applications may benefit from the teachings of the present disclosure, including power plants and mobile platforms, as well as robots and power equipment.

The electric potential of the battery pack 26, particularly when used in the vehicle 20 of FIG. 1, may be in the range of 60-360 VDC or more. For the purposes of the present disclosure, however, the term "high-voltage" refers to a voltage level exceeding typical 12-15 VDC auxiliary voltage levels. At voltage levels in excess of 60 VDC, the battery pack 26 may be used to energize an electric machine (M) 29 via a power inverter module (PIM) 28. The PIM 28 is a semiconductor switching device configured to invert AC power to DC power and vice versa via, e.g., pulse width modulation and filtering techniques, such that the energized electric machine 29 produces output torque (arrow $T_O$) via an output member 32.

The output member 32 is coupled to the drive wheels 16 of the vehicle 20, e.g., via a planetary transmission or gear box (not shown). Generated output torque (arrow $T_O$) may be delivered to drive wheels 16 in some modes of operation, with the drive wheels 16 in rolling contact with a road surface 19 such that the electric machine 29 ultimately propels the vehicle 20. In "mild hybrid" or extended-range EV embodiments, the vehicle 20 may have an internal combustion engine (E) 13 connected to the electric machine 29 via a belted drive arrangement 15, such that when the electric machine 29 is powered by the battery pack 26, the electric machine 29 is operable for cranking and starting the engine 13. Although shown for simplicity as a single electric machine 29 configured as a traction motor and a belted alternator starter, in an actual implementation such functions would be performed by separate electric machines 29 each sized and configured for their respective tasks.

Auxiliary voltage ($V_{AUX}$) used aboard the vehicle 20 may be supplied in part via an auxiliary battery ($B_{AUX}$) 126. The auxiliary battery 126 may be energized via an auxiliary power module (APM) 31, i.e., a voltage regulator operable for reducing DC voltage from the battery pack 26 to a lower level suitable for powering auxiliary electrical systems or components aboard the vehicle 20. The APM 31 and/or the auxiliary battery 126 may serve as auxiliary power supplies as needed within the scope of the present disclosure.

Plug-in embodiments of the vehicle 20 may include a charge coupling device 22 and an AC-DC converter 24, with the AC-DC converter 24 being electrically connected between the charge coupling device 22 and the battery pack 26. As understood in the art, AC-DC converters such as the AC-DC converter 24 shown schematically in FIG. 1 may include, as with the PIM 28, controllable internal electronic components that work together to convert an AC voltage (VAC) into a DC voltage (VDC). Although omitted from the Figures for illustrative simplicity, such internal structure typically includes input and output waveform filters, passive diode bridges, semiconductor switches such as MOSFETs or IGBTs, link capacitors, and one or more transformers. Of these constituent components, the semiconductor switches have rapidly changeable on/off states that are commanded by the controller 50 or another dedicated processor to provide the desired output waveform.

As part of the present approach, the controller 50 of FIG. 1 is programmed to determine a set of input values (arrow $CC_I$) and, using the received input values (arrow $CC_I$), to control operation of the vehicle 20 and/or the battery pack 26 via a set of output signals (arrow $CC_O$). As described below, the input values (arrow $CC_I$) may include an open circuit voltage ($V_o$) and an internal resistance (R) of the battery pack 26, with the open circuit voltage ($V_o$) possibly measured via one or more sensors 11 and/or back-calculated. The same sensor(s) 11 can be used during a charge or discharge event of the battery pack 26 to measure the charge/discharge voltage. The sensor(s) 11 may also include current sensors configured to measure the charge/discharge current. In order to perform assigned functions, the controller 50 includes a processor (P) and memory (M). The memory (M) includes tangible, non-transitory memory, e.g., read only memory, whether optical, magnetic, flash, or otherwise. The controller 50 also includes sufficient amounts of random access memory, electrically-erasable programmable read only memory, and the like, as well as a high-speed clock, analog-to-digital and digital-to-analog circuitry, and input/output circuitry and devices, as well as appropriate signal conditioning and buffer circuitry.

In general, the controller 50 determines a maximum current of the battery pack 26 of FIG. 1 using the set of input values (arrow $CC_I$). Using a simple battery model, $V=V_o+IR$, with V=battery voltage, $V_o$=battery open circuit voltage, I=battery current that is a negative value for discharge and positive for charge, and R=battery internal resistance, i.e., $$R = \frac{dV}{dI}.$$

With $P_{26}$ representing battery power capability:

$$P_{26}=IV=I(V_O+IR)=IV_O+I^2R.$$

Thus, a voltage-limited power capability $P_{26,VL}$ of the battery pack 26 may be expressed mathematically, with $V_M=V_{MIN}$ or $V_{MAX}$ depending on whether the controller 50 is considering a discharge or a charge event, as:

$$P_{26,VL} = \frac{V_M(V_M - V_o)}{R}.$$

The current-limited power capability $P_{26,CL}$ of the battery pack 26 may be similarly expressed with $I_M=I_{MIN}$ or $I_{MAX}$, again depending on whether the controller 50 is considering a discharge or a charge event, as:

$$P_{26,CL}=I_M(V_o+I_MR).$$

Using such relationships, for instance, the controller 50 of FIG. 1 can calculate the maximum discharge current, indicated by the d subscript, i.e., $I_{max,d}$, as follows:

$$P_{26} = IV_o + I^2R_d$$

$$\frac{dP_{26}}{dI} = 0 = V_o + 2IR_d$$

$$I_{max,d} = -\frac{V_o}{2R_d}$$

The maximum charging current, $I_{max,c}$, is limited by the maximum voltage and thus may be calculated by the controller 50 as:

$$I_{max,c} = \frac{(V_{max} - V_o)}{R_c}.$$

Figure 2:
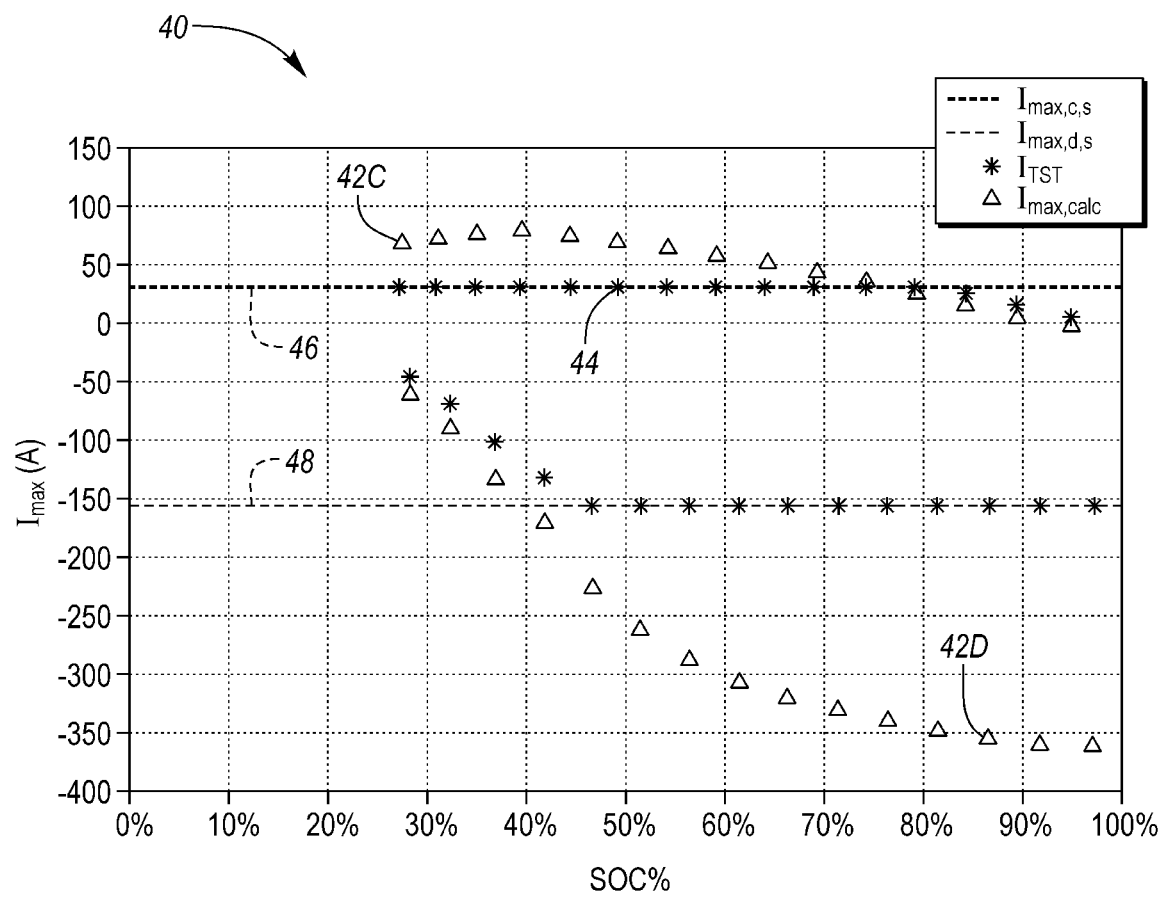
FIG. 2 is a schematic plot of electrical current (vertical axis) versus state of charge (horizontal axis) illustrating a possible variance between a predetermined/manufacturer-provided maximum current and a maximum current as calculated according to the present approach.

FIG. 2 depicts a plot 40 of a relationship between the calculated maximum current ($I_{max}$) in amps (A) on the vertical axis, and a percentage state of charge (SOC %) of the battery pack 26. The state of charge is depicted ranging from 0%/totally-depleted to 100%/fully-charged. Predetermined/manufacturer-provided current limits for the battery pack 26 are depicted as traces 46 and 48, with trace 46 corresponding to an example 20-second maximum charging current ($I_{max,c,s}$) and trace 48 corresponding to the 20-second maximum discharge current ($I_{max,d,s}$). Also indicated via triangles (Δ), trace 42C is the maximum charge current, $I_{max,c,calc}$ and minimum discharge current, $I_{max,d,calc}$, respectively, as calculated by the controller 50, and a measured or tested current, $I_{TST}$, indicated by stars or asterisk (*) as trace 44.

Using such data, the controller 50 is able to select, on a situational basis, whether or not to use the calculated maximum charge/discharge current $I_{max,d,calc}$ (trace 42C) or $I_{max,d,calc}$ (trace 42D) or the predetermined/manufacturer-provided current limits of lines 46 and 48. Note in FIG. 2 that the calculated maximum currents (traces 42D and 42C) match closely with measured/tested currents (trace 44) at both low and high states of charge. Thus, with a high level of confidence, the controller 50 may selectively use the calculated maximum currents (traces 42D and 42C) in lieu of the predetermined/manufacturer-provided current limits of lines 46 and 48 particularly at low and high states of charge in order to calculate power the true power capability of the battery pack 26.

As the data in FIG. 2 is intended to show, the tested currents (trace 44) closely match the calculated maximum charge current (trace 42C) at high states of charge, as well as the calculated maximum discharge current (trace 42D) at low states of charge. However, for the states of charge lying in between, the controller 50 does not violate the predetermined/manufacturer-provided current limits indicated by lines 46 and 48 in FIG. 2. Thus, the controller 50 of FIG. 1 is configured to situationally or selectively use the calculated maximum current of traces 42C, 42D instead of the predetermined or manufacturer-provided current limits of lines 46 and 48 when it is advantageous to do so.

Figure 3A:
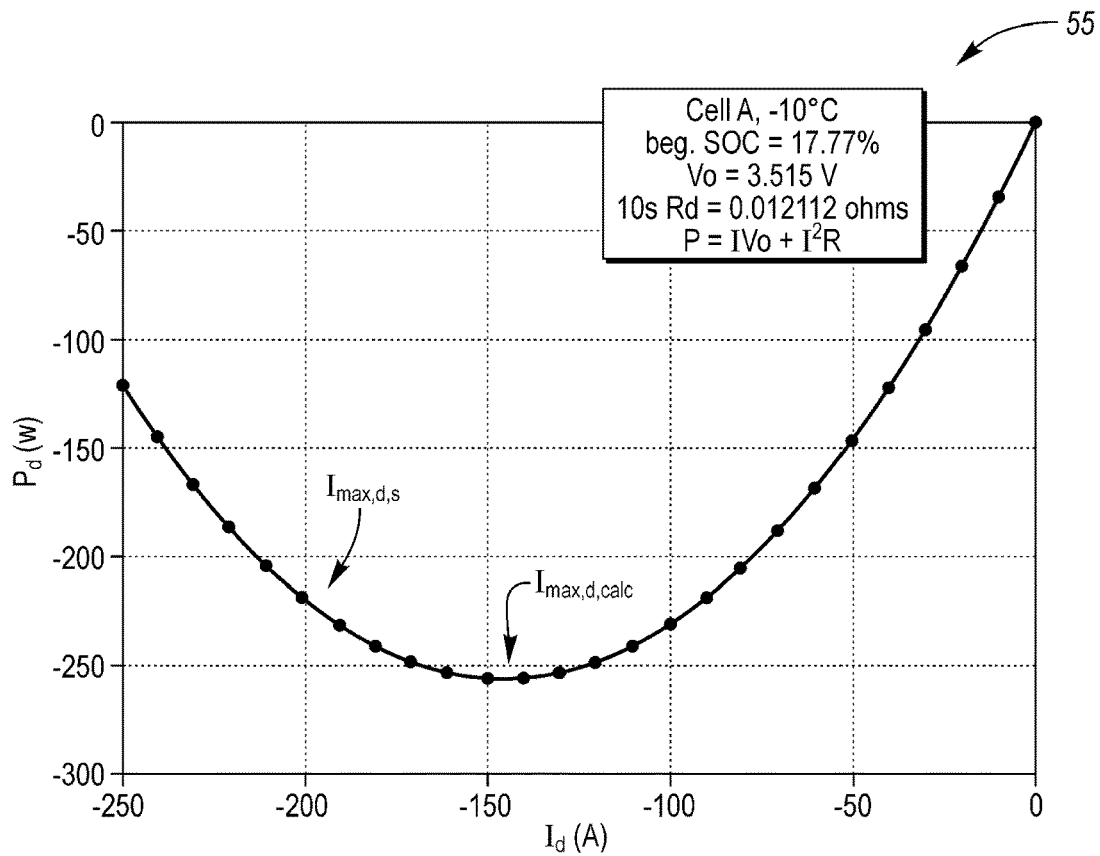
FIGS. 3A and 3B are schematic example plots of battery pack discharge power (vertical axis) versus discharge current (horizontal axis) under a representative set of conditions.
Figure 3B:
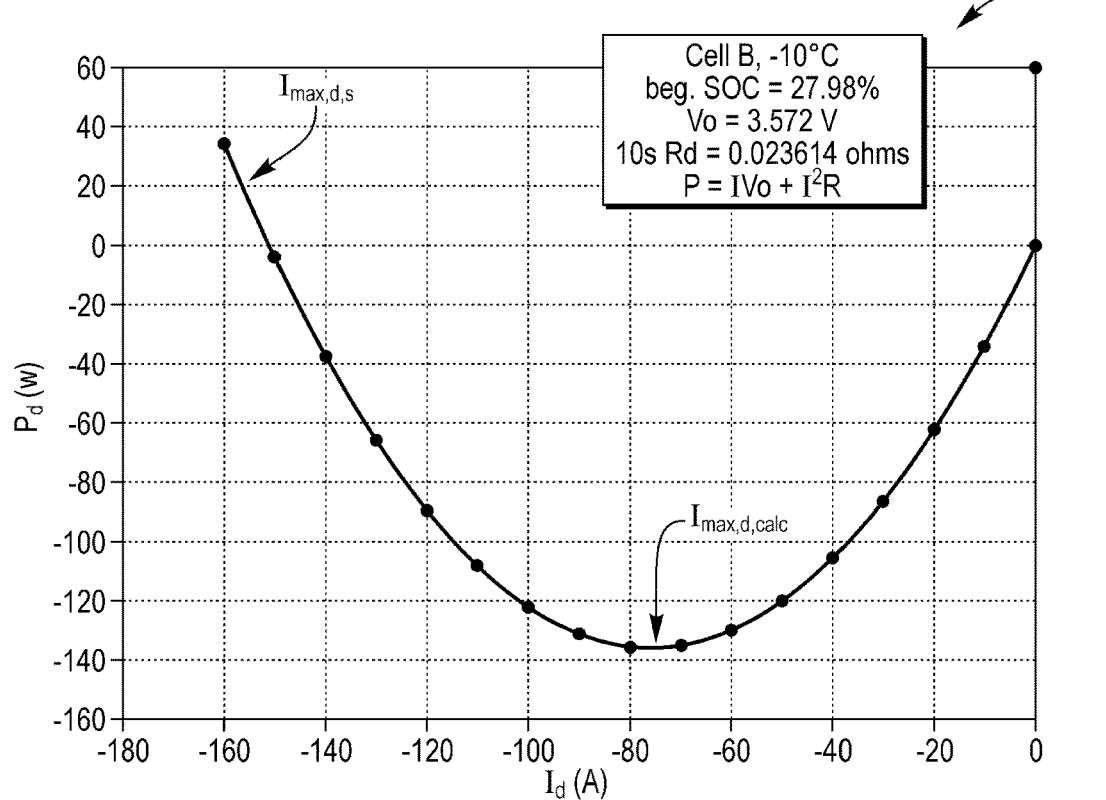

FIGS. 3A and 3B illustrate examples of two example cells of the battery pack 26 of FIG. 1 under specific conditions, e.g., −10° C., with the illustrated traces 55 and 155 being determined via the equation $P=IV_o+I^2R$ for a discharge situation in which $P=P_d$. For FIG. 3A, trace 55 represents the discharge power of a first representative battery cell of the battery pack 26 of FIG. 1 at a beginning state of charge of 17.8%, an open circuit voltage ($V_o$) of 3.515 VDC, and an average resistance ($R_d$) over 10-seconds of 0.012Ω. The example conditions for another cell as shown in FIG. 3B correspond to a higher beginning state of charge of 27.98%, an open circuit voltage ($V_o$) of 3.572 VDC, and an average 10-second resistance ($R_d$) of 0.0236Ω.

In FIG. 3A, a representative predetermined/supplier-provided maximum discharge current ($I_{max,d,s}$) may be about −190 A. However, the calculated maximum discharge current ($I_{max,d,calc}$) may be somewhat less, e.g., −145.1 A in this example. Similarly, in FIG. 3B, the predetermined/manufacturer-provided maximum discharge current ($I_{max,d,s}$) may be about −157.5 A, while the calculated maximum discharge current ($I_{max,d,calc}$) may be −75.63 A. Thus, the predetermined maximum current ($I_{max,d,s}$) is more aggressive than the calculated maximum current ($I_{max,c,calc}$) and underestimates the discharge power capability of the battery pack 26. Therefore, when executing the instructions 100 the controller 50 may situationally disregard the predetermined maximum discharge current ($I_{max,d,s}$) in favor of a lower calculated maximum discharge current ($I_{max,d,calc}$), or may disregard the calculated maximum discharge current ($I_{max,d,calc}$) in favor of a lower predetermined maximum discharge current ($I_{max,d,s}$), in absolute value, in order to optimize performance of the battery pack 26 and/or the vehicle 20 of FIG. 1.

Figure 4:
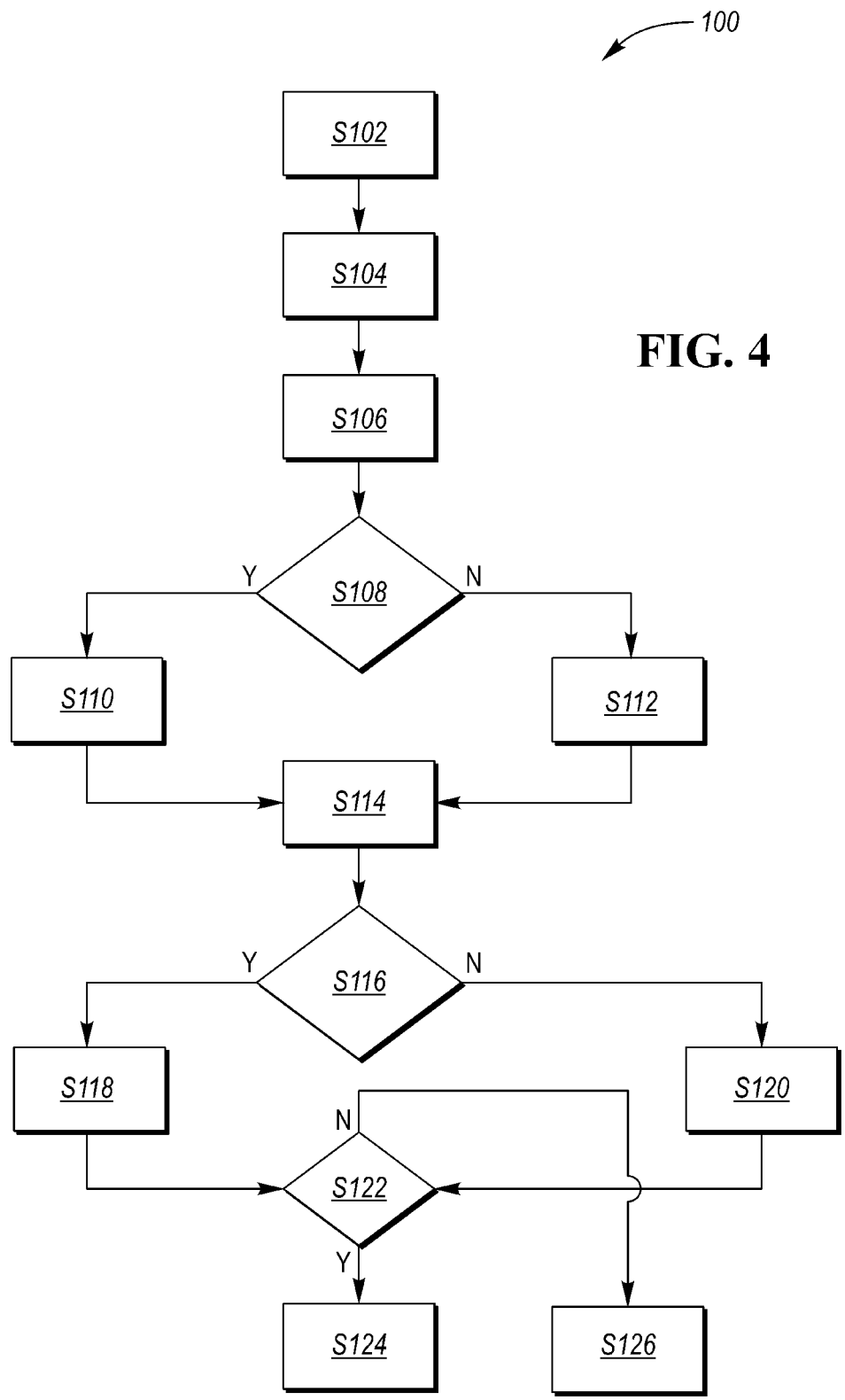
FIG. 4 is a flow chart describing an example embodiment of the current calculation and battery power capability prediction method of the present disclosure.

FIG. 4 describes an example method that may be encoded as instructions 100 within the memory (M) of the controller 50 shown in FIG. 1. Such instructions 100 may be executed via the processor (P) of the controller 50 in order to calculate the maximum current, predict the power capability of the battery pack 26, and ultimately control an operation of the vehicle 20 and/or the battery pack 26 using the predicted power capability. As the instructions 100 embody the method shown in FIG. 4, the method is referred to hereinafter as method 100 for clarity.

The method 100 begins at step S102 with a determination, via measurement or back-calculation, of the open circuit voltage ($V_o$). Step S102 may be conducted cell-by-cell by individually sensing a given cell of the battery pack 26, e.g., via the voltage sensor 11, such that the electric potential difference between positive and negative terminals of the battery cell is measured. The total open circuit voltage ($V_o$) of the battery pack 26 may be determined as the sum of the individual open circuit voltages of the cells in series. The method 100 proceeds to step S104 once the open circuit voltage ($V_o$) of the battery pack 26 has been determined.

Step S104 includes calculating the real-time resistance of the battery pack 26, e.g., during a discharge event. This value ($R_d$) may be determined over a specific window of time, e.g., 10-20 s, as $$R_d = \frac{dV}{dI},$$

with V and I respectively being a measured voltage and current during the discharge event. The method 100 thereafter proceeds to step S106.

At step S106, the controller 50 next calculates the maximum current ($I_{d,max}$) using the open circuit voltage ($V_o$) from step S102 and calculated resistance from step S104. In a discharge event, this value is the discharge current ($I_{d,max}$), and thus $$I_{d,max} = -\frac{V_o}{2R_d}.$$

This value is temporarily recorded in memory (M). Calculation of the maximum current may be performed by the controller 50 at various states of charge and temperatures of the battery pack 26, with such values optionally recorded in a lookup table for later access. Likewise, calculating the maximum current may occur at different ages of the battery pack 26, such that the power capability ultimately calculated below corresponds to the actual age of the battery pack 26. The controller 50 then proceeds to step S108.

At step S108 the controller 50 compares the absolute value of the maximum current ($I_{d,max}$) determined at step S106 to the absolute value of the predetermined/manufacturer-provided maximum current, i.e., $I_{d,max,s}$. The predetermined maximum current ($I_{d,max,s}$) may be pre-recorded in memory (M) and readily accessible by the controller 50 in executing step S108. The controller 50 proceeds to step S110 if the absolute value of the calculated maximum current ($I_{d,max}$) is greater than the absolute value of the predetermined maximum current ($I_{d,max,s}$), or to step S112 in the alternative if the absolute value of the calculated maximum current ($I_{d,max}$) is less than the absolute value of the predetermined maximum current ($I_{d,max,s}$).

Step S110 includes selecting the predetermined/manufacturer-provided maximum current ($I_{d,max,s}$) and proceeding to step S114.

Step S112 includes selecting the calculated maximum current ($I_{d,max}$) and proceeding to step S114. That is, the controller 50 determines that the predetermined maximum current ($I_{d,max,s}$) is too aggressive and will underestimate the real power capability of the battery pack 26. As a result, the controller 50 proceeds with the calculated maximum current ($I_{d,max}$).

At step S114, the controller 50 calculates the current-limited and the voltage-limited power capabilities for the battery pack 26 using a selected maximum current value ($I_M$), with $I_M$ being either the calculated maximum current ($I_{d,max}$) or the predetermined maximum current ($I_{d,max,s}$) depending on the result of step S108. Thus, step S114 includes calculating two different power limits, i.e., $P_{d,CL}$ and $P_{d,VL}$, with the subscripts "CL" and "VL" representing the current-limited and voltage-limited power capabilities, respectively.

As noted above, a supplier or manufacturer of the battery pack 26 specifies the minimum and maximum voltage ($V_{min}$ and $V_{max}$) used in the discharge and charge voltage-limited power calculations, respectively. Battery chemistry dictates what the absolute values of $V_{min}$ and $V_{max}$ can be, thermodynamically. The battery supplier stipulates the operating voltage limits in such a way as to get the most energy and power out of the battery pack 26 without jeopardizing battery life or structural integrity. Thus, the minimum voltage ($V_{min}$) is used for calculating discharge voltage-limited power, while the maximum voltage ($V_{max}$) is used for calculating the charge voltage-limited power.

In an example discharge scenario, the current-limited power capability ($P_{d,CL}$) and voltage-limited power capability ($P_{d,VL}$) may be calculated as:

$$P_{d,CL} = I_M V_O + I_M^2 R_d$$

$$P_{d,VL} = \frac{V_M(V_M - V_O)}{R_d}$$

where $V_M$ is equal to $V_{min}$. The method 100 proceeds to step S116 when the power capabilities $P_{d,VL}$ and $P_{d,CL}$ are determined by the controller 50.

Step S116 includes comparing the power capabilities $P_{d,VL}$ and $P_{d,CL}$ from step S114 to determine which of the two power values is lower. The method 100 proceeds to step S118 when the current-limited power capability ($P_{d,CL}$) is less than the voltage-limited power capability ($P_{d,VL}$), or alternatively to step S120 when the voltage-limited power capability ($P_{d,VL}$) is the lower of the two power values.

Steps S118 and S120 include recording the value from step S116 and discarding the higher of the two power values, and thereafter proceeding to step S122.

At step S122, the controller 50 next determines whether the selected power capability from steps S118 or S120, i.e., the respective current-limited or voltage-limited power capabilities $P_{d,CL}$ or $P_{d,VL}$, exceeds a calibrated threshold ($P_{CAL}$). The calibrated threshold ($P_{CAL}$) may be determined in real-time based on control inputs to the controller 50 and the particular electrical task being performed.

For example, during normal drive operations in which the electric machine 29 of FIG. 1 is configured as a traction motor for propelling the vehicle 20, step S122 may entail deciding if sufficient power capability exists for satisfying an operator-requested torque, rotational speed, and/or acceleration. Such requests may be determined via the controller 50 using various approaches, e.g., measurement or calculation of braking input, acceleration requests, steering angle and/or rate, and other typical dynamic control inputs.

Alternatively, when the battery pack 26 drives an engine cranking/starting process, step S122 may involve determining whether sufficient cold-cranking power exists in the battery pack 26 for completing the engine cranking/starting process in a calibrated amount of time. The method 100 proceeds to step S124 when the power capability $P_{d,VL}$, or $P_{d,CL}$ exceeds the calibrated threshold ($P_{CAL}$), and to step S126 in the alternative when the calibrated threshold ($P_{CAL}$) exceeds the selected power capability $P_{d,VL}$ or $P_{d,CL}$.

Step S124 entails executing a control action in response to the determination at step S122 that the power capability $P_{d,VL}$ or $P_{d,CL}$ exceeds the calibrated threshold ($P_{CAL}$), by recording a control decision (D1) that the requested operation from step S122 be executed. "Control action" may encompass changing or regulating/controlling a state of the vehicle 20, or other system having the battery pack 26, using the calculated power capability. For instance, step S124 may entail executing a requested drive operation of the vehicle 20 by delivering a requested speed, torque, and/or acceleration of the electric machine 29, or proceeding with a cold-cranking operation of the engine 13 as noted above. The method 100 is complete upon completion of this action, resuming anew with step S102.

Step S126 entails executing a control action in response to the determination at step S122 that the calibrated threshold ($P_{CAL}$) exceeds the selected power capability $P_{d,VL}$ or $P_{d,CL}$, i.e., another control decision (D2) is made that the requested drive operation of the vehicle 20 or the cold-cranking operation cannot be completed. Control decision D2 may include commanding a transition to a reduced-power output mode of the battery pack 26, i.e., by delivering less electrical power to the electric machine 29 of FIG. 1 than might otherwise be optimal levels for presently-requested torque, acceleration, and/or speed levels. The method 100 is complete with this action, resuming anew with step S102.

DC Fast-Charging

As is well known in the art, when the vehicle 20 of FIG. 1 is configured to enable charging of the battery pack 26 via a DC fast-charging process, such a charging process proceeds in graduated charging stages. That is, the battery pack 26 is rapidly charged to a threshold state of charge. Upon reaching the threshold state of charge, parameters of the DC fast-charging process are modified in order to slow the charging rate in one or more subsequent charging steps, e.g., by reducing the charging voltage as the charge voltage increases. In this manner, the charge of the battery pack 26 can be effectively "topped off" without damaging the battery pack 26.

Figure 5:
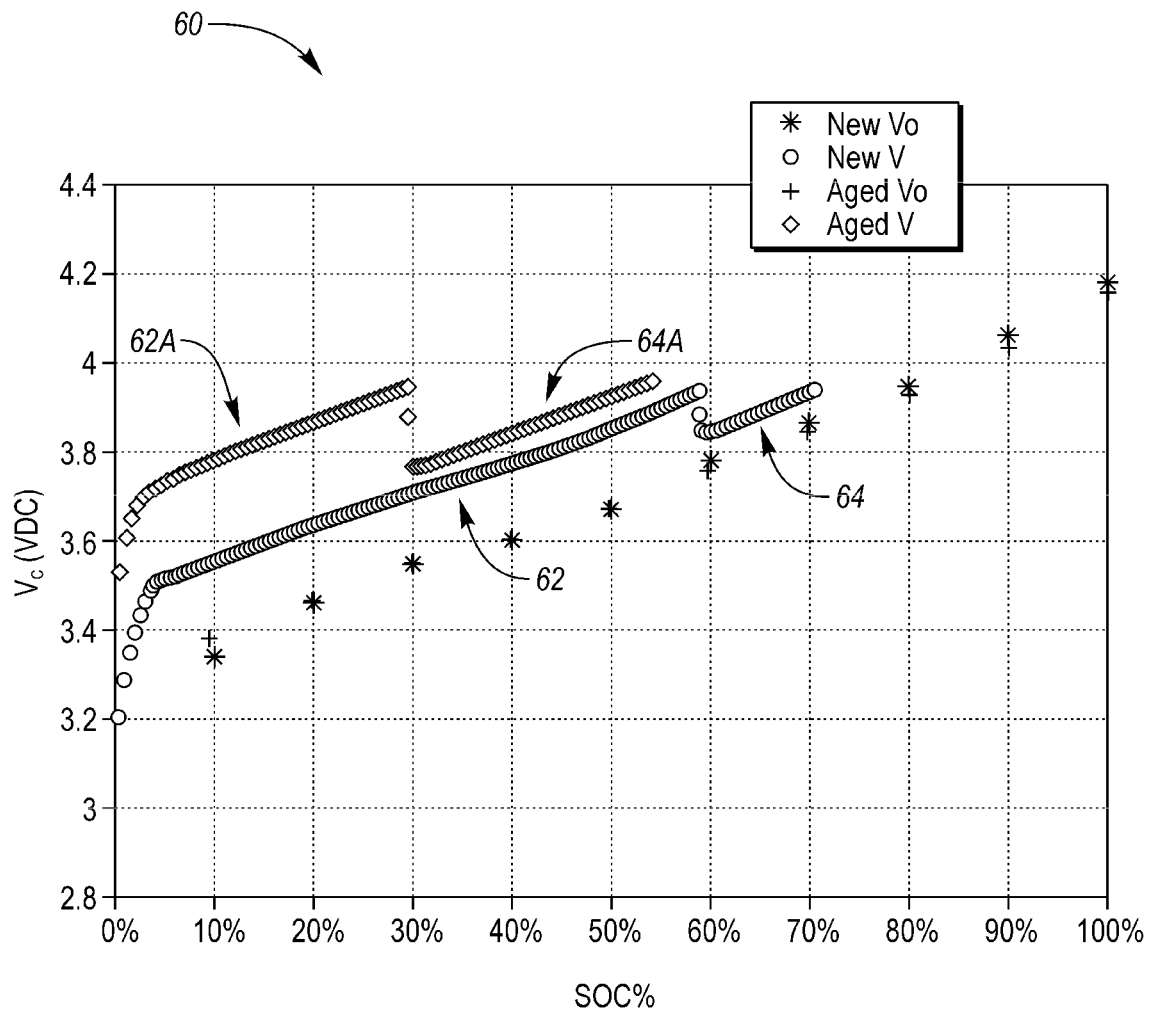
FIG. 5 is a schematic plot of a DC fast-charging voltage (vertical axis) versus a percentage state of charge (horizontal axis) illustrating a possible variance between a new and an aged battery pack.

The charging stages of a DC fast-charging process are depicted schematically via a comparative plot 60 in FIG. 5 as charging stages 62 and 64 for a new battery pack 26, as well as charging stages 62A and 64A for an aged battery pack 26. State of charge (SOC %) is depicted on the horizontal axis, with 100% corresponding to a full charge and 0% representing a depleted battery pack 26, and with charging voltage ($V_c$) is depicted on the vertical axis. FIG. 5 represents that an aged battery pack 26 requires a higher charging voltage than a new battery pack 26 in order to achieve a given state of charge. It is therefore possible for the controller 50 of FIG. 1 to adaptively change charging parameters, including charging current, as the battery pack 26 ages to as to compensate for age-related increases in battery resistance.

As part of such an approach, the controller 50 may determine the relationship between the open circuit voltage ($V_o$) and state of charge (SOC), and thereafter predict the amount of current needed to charge the battery pack 26 to a particular SOC. That is, the controller 50 may determine the maximum charging current that can be used to charge the battery pack 26 to the above-noted (i) states of charge, i.e., $SOC_i$, in each stage of DC fast-charging. First, the controller 50 can determine the corresponding open circuit voltage for each state of charge ($SOC_i$), i.e., $V_{o,i}=f(SOC_i)$, and determine the charge resistance $R_{c,i}$ from a recent or previous DC fast-charging event based on the measured charge voltage and current change:

$$R_{c,i} = \frac{dV_{c,i}}{dI_{c,i}}$$

Then, the controller 50 can predict the charge current ($I_{c,i}$) that is necessary to charge to a particular $SOC_i$ and $V_{c,i}$ for each step (i):

$$I_{c,i} = \frac{(V_{c,i} - V_{o,i})}{R_{c,i}}$$

Thus, as $R_{c,i}$ increases with age of the battery pack 26, the charge current $I_{c,i}$ is expected to decrease when charging to the same charge voltage $V_{c,i}$ and state of charge $SOC_i$. Alternatively, the controller 50 can then predict the state of charge ($SOC_i$) that is attainable for a given charging current:

$$V_{o,i} = V_{c,i} - I_{c,i} R_{c,i} = f(SOC_i)$$

Here again, as resistance $R_{c,i}$ increases with battery age, the open-circuit voltage $V_{o,i}$ and the state of charge $SOC_i$ are expected to decrease when charging at the same charge current, $I_{c,i}$, to the same charge voltage $V_{c,i}$.

Various information is made known to the controller 50 using the above-described approach. For instance, the controller 50 can associate or correlate the open circuit voltage ($V_{o,i}$) with the states of charge ($SOC_i$) as a set of correlation data. The controller 50 may predict, using such correlation data, a state of charge of the battery pack 26 that is attainable for each of the DC charging stages. The controller 50 may also predict the charging time needed for reaching a given SOC.

To do this, the controller 50 may predict the charge capacity ($Ah_{c,i}$) in each charging step (i), i.e.:

$$Ah_{c,i} = (SOC_i - SOC_{i-1}) \cdot Ah_{tot}$$

$$SOC = \Sigma \frac{Ah_{c,i}}{Ah_{tot}}$$

where $Ah_{c,i}$, and $Ah_{tot}$ represent the Amp-hours in each charge step and the total charge for a full charge, respectively. The total charge time (t) may therefore be represented by the sum of the charge times in all of the example charge steps as:

$$t = \Sigma \left( \frac{Ah_{c,i}}{I_{c,i}} \right).$$

Using the above-described approach, the controller 50 calculates the maximum charge or discharge current to or from the battery pack 26 based on open circuit voltage ($V_o$) and real-time resistance (R) of the battery pack 26 at the time of use. The controller 50 then verifies the predetermined/supplier-provided maximum current against a controller-calculated current to assess if the supplier's value is too conservative or overly aggressive, with either case possibly resulting in underestimation of the real power capability of the battery pack 26. Use of the method 100 may help the controller 50 in avoiding underestimation of discharge pulse power and cold cranking power capabilities, particularly at low states of charge and cold temperatures when battery resistance tends to be high. As a further control action, the controller 50 may automatically correct the maximum discharge current value used in Battery State Estimator logic, i.e., logic that predicts the battery power capability for range prediction, powertrain control regulation, and other purposes, particularly as resistance increases with age of the battery pack 26. Improving accuracy of power capability estimation allows the controller 50 to improve upon existing performance of the vehicle 20 of FIG. 1 or other systems using the battery pack 26 at various states of charge, temperatures, and ages.

While the best modes for carrying out the disclosure have been described in detail, those familiar with the art to which this disclosure relates will recognize various alternative designs and embodiments for practicing the disclosure within the scope of the appended claims.

What is claimed is:

1. A method for calculating a maximum current and predicting a power capability of a battery pack in a system, the method comprising:
    determining an open-circuit voltage of the battery pack via a controller;
    measuring a voltage and current during a charge or discharge event of the battery pack;
    calculating an internal resistance of the battery pack using the measured voltage and the measured current;
    calculating the maximum current of the battery pack using the open-circuit voltage and the internal resistance;
    selecting one of:
        an absolute value of the calculated maximum current if the absolute value of the calculated maximum current is less than an absolute value of a predetermined current limit, or
        the absolute value of the predetermined current limit if the absolute value of the predetermined current limit is less than the absolute value of the calculated maximum current;
    predicting the power capability of the battery pack using the selected lower absolute value of the calculated maximum current or the predetermined current limit; and
    controlling a state of the system using the calculated power capability.

2. The method of claim 1, wherein determining the open-circuit voltage includes measuring the open-circuit voltage.

3. The method of claim 1, wherein calculating the maximum current is performed by the controller at various states of charge and temperatures of the battery pack.

4. The method of claim 1, further comprising: calculating the maximum current at different ages of the battery pack such that the calculated power capability corresponds to an actual age of the battery pack.

5. The method of claim 1, wherein the system includes an electric machine powered by the battery pack, and wherein controlling a state of the system includes controlling a speed, torque, or acceleration of the electric machine.

6. The method of claim 1, wherein the system includes an engine and an electric machine powered by the battery pack, and wherein controlling a state of the system includes cranking and starting the engine using the electric machine.

7. The method of claim 1, wherein the battery pack is configured to receive a direct current (DC) charging current in multiple DC charging stages via a DC fast-charging process, the method further comprising:
    correlating the open circuit voltage with respective states of charge of the battery pack as a set of correlation data;
    predicting, via the controller using the correlation data, a state of charge of the battery pack attainable for each of the DC charging stages; and
    predicting a charging time for achieving a target SOC;
    wherein controlling the state of the system includes controlling a charging duration of the DC fast-charging process using the predicted charging time.

8. The method of claim 1, wherein the system is a vehicle having an electric powertrain, and wherein controlling a state of the system using the calculated power capability includes controlling a state of the electric powertrain.

9. A system comprising:
    a battery pack;
    an electric machine that is electrically connected to and driven by the battery pack; and
    a controller in communication with the battery pack, having a processor, and configured to calculate a maximum current and predict a power capability of the battery pack via execution of instructions by the processor, wherein execution of the instructions causes the controller to:
        determine an open-circuit voltage of the battery pack;
        measure a voltage and a current during a charge or discharge event of the battery pack;
        calculate an internal resistance of the battery pack using the measured voltage and the measured current;
        calculate the maximum current using the open-circuit voltage and the internal resistance;
        select:
            an absolute value of the calculated maximum current if the absolute value of the calculated maximum current is less than an absolute value of a predetermined current limit, or
            the absolute value of the predetermined current limit if the absolute value of the predetermined current limit is less than the absolute value of the calculated maximum current;
        predict the power capability of the battery pack using the selected absolute value of the calculated maximum current or the predetermined current limit; and
        control a state of the system using the calculated power capability.

10. The system of claim 9, wherein the electric machine is a traction motor.

11. The system of claim 9, further comprising an engine, wherein the electric machine is configured to crank and start the engine.

12. The system of claim 9, further comprising at least one voltage sensor, wherein the controller is configured to determine the open-circuit voltage by measuring the open-circuit voltage via the at least one voltage sensor.

13. The system of claim 9, wherein the controller is configured to calculate the maximum current at various states of charge and temperatures of the battery pack.

14. The system of claim 9, wherein the controller is configured to calculate the maximum current at different ages of the battery pack such that the calculated power capability of the battery pack corresponds to an actual age of the battery pack.

15. The system of claim 9, wherein the system is a vehicle having an electric powertrain, and the controller is configured to control a state of the electric powertrain using the calculated power capability.

16. The system of claim 15, wherein the vehicle is configured to receive a direct current (DC) charging current in multiple DC charging stages via a DC fast-charging process, and wherein the controller is configured to:
   correlate the open circuit voltage with respective states of charge of the battery pack as a set of correlation data;
   predict, using the correlation data, a state of charge of the battery pack attainable for each of the DC charging stages;
   predict a charging time for achieving a target SOC; and
   control the state of the system by controlling a charging duration of the DC fast-charging process using the predicted charging time.

17. A vehicle comprising:
   a set of drive wheels;
   a battery pack;
   an electric traction motor having an output member that is coupled to the drive wheels, and that is electrically connected to and driven by the battery pack; and
   a controller in communication with the battery pack, having a processor, and configured to calculate a maximum current and predict a current-limited power capability and a voltage-limited power capability of the battery pack via execution of instructions by the processor, wherein execution of the instructions causes the controller to:
      determine an open-circuit voltage of the battery pack;
      measure a voltage and a current during a charge or discharge event of the battery pack;
      calculate an internal resistance of the battery pack using the measured voltage and the measured current;
      calculate the maximum current using the open-circuit voltage and the internal resistance;
      select an absolute value of the calculated maximum current if the absolute value of the calculated maximum current is less than an absolute value of a predetermined current limit, or select the absolute value of the predetermined current limit if the absolute value of the predetermined current limit is less than the absolute value of the calculated maximum current;
      predict the current-limited and the voltage-limited power capabilities of the battery pack which each use the selected lower absolute value of the calculated maximum current or the predetermined current limit; and
      control an operating state of the vehicle via control of the electric traction motor using the calculated power capability.

18. The vehicle of claim 17, wherein the vehicle is configured to receive a direct current (DC) charging current in multiple DC charging stages via a DC fast-charging process, and wherein the controller is configured to:
   correlate the open circuit voltage with respective states of charge of the battery pack as a set of correlation data;
   predict, using the correlation data, a state of charge of the battery pack attainable for each of the DC charging stages;
   predict a charging time for achieving a target SOC; and
   control the state of the vehicle by controlling a charging duration of the DC fast-charging process using the predicted charging time.

* * * * *